United States Patent [19]

Ikeuchi et al.

[11] Patent Number: 4,748,039

[45] Date of Patent: May 31, 1988

[54] METHOD FOR PRODUCING SHRIMP-SHAPED FOOD PRODUCTS

[75] Inventors: Hiroji Ikeuchi; Kiyoaki Ikeuchi, both of Akashi, Japan

[73] Assignee: Kabushiki Kaisha Ikeuchi Tekkosho, Akashi, Japan

[21] Appl. No.: 75,575

[22] Filed: Jul. 20, 1987

[30] Foreign Application Priority Data

Jan. 22, 1987 [JP] Japan .................................. 62-13104

[51] Int. Cl.⁴ .......................... A23L 1/325; A23P 1/00
[52] U.S. Cl. ...................................... 426/513; 426/643
[58] Field of Search ........................ 426/513, 643, 412; 425/542

[56] References Cited

U.S. PATENT DOCUMENTS 4,497,844  2/1985  Hice et al. ............................. 426/513
4,579,741  4/1986  Hanson et al. ........................ 426/513

*Primary Examiner*—George Yeung
*Attorney, Agent, or Firm*—Marshall, O'Toole, Gerstein, Murray & Bicknell

[57] ABSTRACT

A method and apparatus for producing shrimp-shaped food products from minced fish meat by injecting minced fish meat material into a split-in-two mold having a cavity shaped as a shelled-shrimp-shaped product, and then heating the minced fish meat material together with the mold to produce a shrimp-shaped food product. The mold has an injection opening for injecting the minced fish material into the cavity, the injection opening extending from the root or base of the shrimp's head to the shrimp's back portion and being oriented upwardly. After injecting the minced fish meat into the cavity, a V-shaped device which can be freely moved in the vertical direction is lowered towards the opening of the mold to make a longitudinal groove in the minced fish material, and then the mold is heated up to produce a shrimp-shaped food product.

3 Claims, 1 Drawing Sheet

METHOD FOR PRODUCING SHRIMP-SHAPED FOOD PRODUCTS

FIELD AND BACKGROUND OF THE INVENTION

The present invention relates to a method and apparatus for producing a food product from minced fish meat and the like, having the appearance of cooked-and-peeled shrimp.

Apparatus for producing food products having the appearance of cooked-and-peeled shrimp from minced fish meat are disclosed in the applicants' U.S. patent application Ser. No. 818,618, now U.S. Pat. No. 4,692,341, and Ser. No. 879,984. These applications, the disclosures therein being incorporated into this application by reference, disclose apparatus including a split-in-two metal mold having a cavity in the shape of a cooked-and-peeled or shelled shrimp, a device for spraying a dye over the inner surface of the mold, a filler for injecting minced fish meat into the mold cavity, a heating device for heating and solidifying the minced fish meat in the mold, and a device for removing the food product from the mold. The shrimp-like food product thus produced has a fan-like tail at one end, an arcuate abdomen portion in the center, and a thicker end which, in a real shrimp, is broken off from the head. As shown in FIG. 4 herein, the mold cavity for forming the shelled-shrimp-like food product has its fishmeat receiving opening at the thicker end where the removed head is connected.

The shelled-shrimp-shaped food products produced by the above-mentioned apparatus have the appearance of the natural or real products. When the natural shrimps are large in size, their gut portion extending from the head to the back is removed during the cooking-and-peeling process. The resulting groove does not become colored even after heating, and both ridges or sides of the groove swell after heating. If the simulated food product were formed in this shape by the mold, the product could not be removed out of the mold. If the mold were shaped so that the product can be removed from the mold, the resulting food would not have a natural appearance.

SUMMARY OF THE INVENTION

The present invention provides a method and apparatus for producing shrimp-shaped food products from minced fish meat by injecting minced fish meat material into a split-in-two metal mold having a cavity shaped as a shelled-shrimp-shaped product, and then heating the minced fish meat material together with the mold to produce a shrimp-shaped food product. The mold has an injection opening for injecting the minced fish material into the cavity, the injection opening extending from the root or base of the shrimp's head to the shrimp's back portion and being oriented upwardly, whereby after injecting the minced fish meat into the cavity, a V-shaped device which can be freely moved in the vertical direction is lowered towards the opening of the mold to make a longitudinal groove in the minced fish material, and then the mold is heated up to produce a shrimp-shaped food product.

BRIEF DESCRIPTION OF THE DRAWING

The present invention will be better understood from the following detailed description of a preferred embodiment, taken in conjunction with the accompanying drawing, wherein.

DETAILED DESCRIPTION OF THE DRAWING

Figure 1:
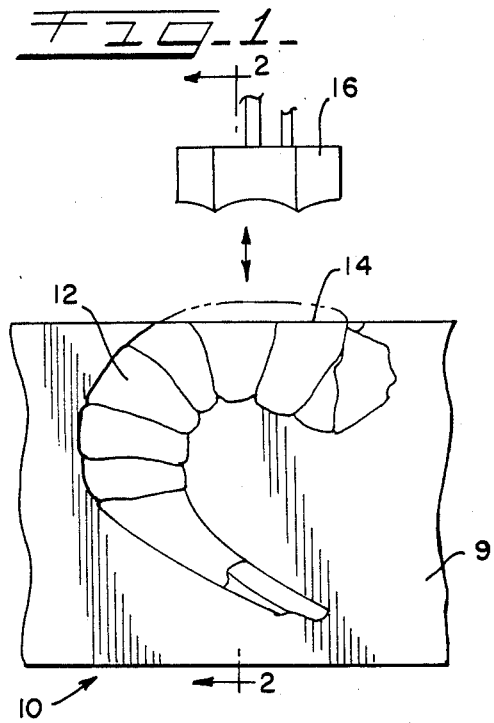
FIG. 1 is a front view of the inner side of one section of a split mold in accordance with this invention.
Figure 2:
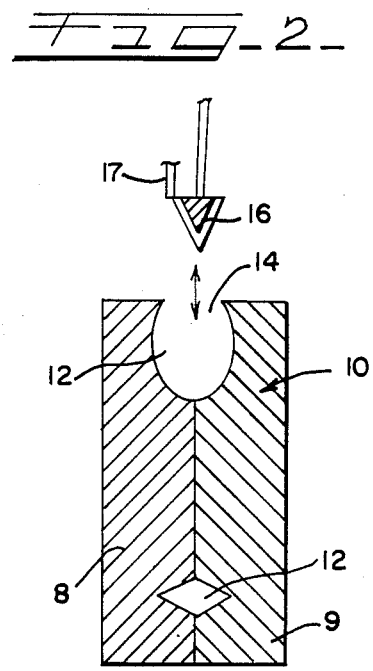
FIG. 2 is a sectional view along the line 2—2 of FIG. 1.

With reference to FIGS. 1 and 2, the mold 10 includes two halves or sections 8 and 9 which have a cavity 12 between them for molding a cooked-and-peeled-shrimp-shaped food product. When the mold halves 8 and 9 are mated together, they form a closed cavity resembling the shape of a shelled shrimp. An injection opening 14 of the cavity 12 is located in the top of the mold, and the cavity 12 is shaped so that the shrimp's head and back portion extend to the top of the mold and to the opening 14.

Above the mold 10 is a vertically movable V-sectioned device 16 which is in the shape of a wedge and is located above the joint of the mold 10 and the opening 14, and the device 16 may be lowered down to the level of the opening 14 of the mold 10. The device 16 may have wave-shaped or scalloped surfaces as shown in FIG. 1 to resemble the nodes of the natural cooked-and-peeled shrimp. It will be convenient to arrange the device 16 with a water supply tube 17 adjacent it so that water oozes out and across the device 16 to keep the lower wedge surface wet. This prevents the minced fish meat material from sticking to the device 16 when a groove is pressed into the paste-like material.

Figures 3A, 3B, 3C, 3D:
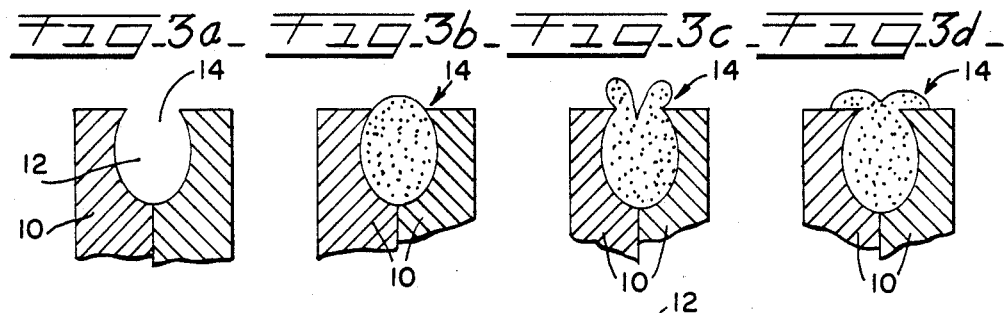
FIGS. 3a, 3b, 3c and 3d are fragmentary views of a portion of FIG. 2, showing steps in molding a food product.
Figure 4:
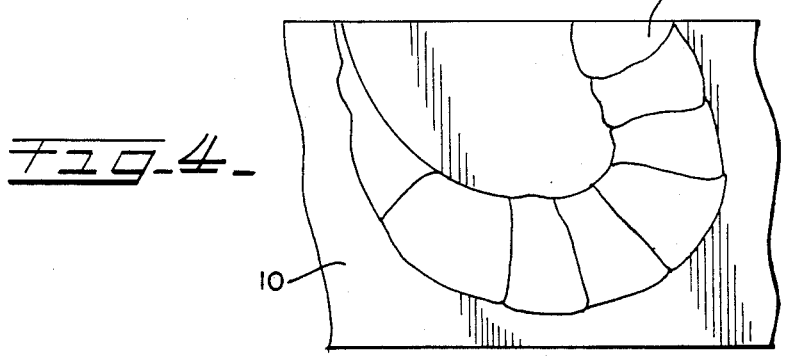
FIG. 4 is a view of a prior art section of a split mold.

FIGS. 3a to 3d illustrate the steps in the production process. FIG. 3a shows the process prior to injection of the minced fish material into the mold; the desired dye is preferably applied over the internal surface of the cavity 12 before the injection of the minced fish meat material, as described in the previously mentioned patent applications. FIG. 3b shows the state upon the completion of injection of the minced fish meat material. The material swells over the top of the opening of the mold 10. FIG. 3c shows the state after lowering the V-sectioned device 16 onto the meat material and then raising it from the top of the opening 14, thereby forming a groove 18 in the material at the opening 14. FIG. 3d shows the state after heating the mold 10 filled with the material to solidify the minced fish meat material. The solidified food product protrudes extensively over the flat upper surface of the mold. Then, the product can be removed from the mold 10. The product has a groove extending from the shrimp head to the back, with both ridges of the groove having a swelled appearance. Thus its appearance closely resembles that of cooked natural shrimp.

In summary, the invention relates to apparatus and process for producing shelled-shrimp-like food products by injecting minced fish meat into a split-in-two metal mold having a cavity for molding a shelled-shrimp-like food product, and heating the minced fish meat material together with the mold. The mold has the opening for injecting the minced fish meat into the mold cavity at the portion corresponding to the connection of the shrimp's head with its back, and the opening is oriented upwardly. As a result, when the minced fish meat is injected into the opening, the minced fish meat swells out of the opening after injection. When the V-section device is lowered into the swelled portion to impress a longitudinal groove in the back of the product and after the device is raised, a groove is formed in the swelled minced meat material at the opening. Then, when the minced fish meat is heated together with the mold to solidify the meat, the swelled portion at the opening will increase its irregularity in shape, thus closely resembling the swell of the natural gutted, cooked and shelled shrimp. The finished heated and solidified food product is then removed from the mold.

In accordance with the present invention, the swell of the ridges of the back portion varies from product to product. The appearance of the product thus has a closer resemblance to that of cooked natural shrimp, thereby assuring a higher market value.

What is claimed is:

1. A method for producing shrimp-shaped products from minced fish meat material using a split mold having a shrimp-shaped mold cavity therein, the cavity having an injection opening for receiving the material and the opening being oriented along the backside of the shrimp, comprising the steps of injecting minced fish meat material into the cavity of the split mold and filling the injection opening, forming a V-shaped groove in the portion of the material which appears at said injection opening, and then heating the mold to produce a shrimp-shaped food product.

2. The method according to claim 1, wherein the groove is formed by a V-shaped device, and further including the step of wetting said device prior to forming said groove.

3. The method according to claim 1, and further including the step of forming scalloped sides of said groove.

* * * * *